United States Patent
Shimonaka et al.

(10) Patent No.: US 7,439,101 B2
(45) Date of Patent: Oct. 21, 2008

(54) RESIN ENCAPSULATION MOLDING METHOD FOR SEMICONDUCTOR DEVICE

(75) Inventors: Tomoya Shimonaka, Kyoto (JP); Muneo Miura, Singapore (SG); Andrew Ong Soon Lee, Singapore (SG)

(73) Assignee: Towa Corporation, Kyoto (JP)

( * ) Notice: Subject to any disclaimer, the term of this patent is extended or adjusted under 35 U.S.C. 154(b) by 379 days.

(21) Appl. No.: 11/180,717

(22) Filed: Jul. 14, 2005

(65) Prior Publication Data

US 2006/0014328 A1    Jan. 19, 2006

(30) Foreign Application Priority Data

Jul. 16, 2004  (JP) .............. 2004-209391

(51) Int. Cl.
  *H01L 21/48* (2006.01)
(52) U.S. Cl. .................. 438/124; 438/126; 438/127
(58) Field of Classification Search ........... 438/127, 438/126, 124; 264/276, 272.17, 272.15
See application file for complete search history.

(56) References Cited

U.S. PATENT DOCUMENTS

| | | | |
|---|---|---|---|
| 6,344,162 B1 | 2/2002 | Miyajima | |
| 6,554,598 B1 | 4/2003 | Tsuruta | |
| 6,613,180 B2 * | 9/2003 | Sunagawa et al. | 156/285 |
| 6,770,236 B2 * | 8/2004 | Miyajima | 264/511 |
| 6,900,508 B2 * | 5/2005 | Chiu et al. | 257/414 |
| 6,978,540 B2 * | 12/2005 | Morganelli et al. | 29/832 |
| 2002/0164391 A1 | 11/2002 | Shinma | |

FOREIGN PATENT DOCUMENTS

| | | |
|---|---|---|
| JP | 2002-059453 A | 2/2002 |
| JP | 2002-254481 | 9/2002 |
| JP | 2004-119410 A | 4/2004 |
| JP | 2004-119816 | 4/2004 |

\* cited by examiner

*Primary Examiner*—Michael Trinh
(74) *Attorney, Agent, or Firm*—Birch, Stewart, Kolasch & Birch, LLP

(57) ABSTRACT

According to a resin encapsulation molding method for a semiconductor device, a resin-encapsulated substrate having a semiconductor device that is mounted on the substrate and that has a portion exposed is formed. With the method, a device-mounted substrate on which the semiconductor device is mounted is prepared and then the device-mounted substrate is set in one mold part. A release film is thereafter provided between the device-mounted substrate and the other mold part opposite to that one mold part. The one and other mold parts are then closed to press the release film against the portion of the semiconductor device. The device-mounted substrate has a projection enclosing the portion of the semiconductor device for preventing resin flash from being formed. When the mold parts are closed, the release film is pressed against the projection to allow the projection to dig into the release film.

4 Claims, 6 Drawing Sheets

RESIN ENCAPSULATION MOLDING METHOD FOR SEMICONDUCTOR DEVICE

BACKGROUND OF THE INVENTION

1. Field of the Invention

The present invention relates to a method using a release film for resin-encapsulating a semiconductor device.

2. Description of the Background Art

According to a method that has been employed, a semiconductor device (chip) comprised of such an element as CPU (Central Processing Unit) for example is encapsulated with resin in the state where the semiconductor device is mounted on a substrate. With this method, a resin-encapsulated substrate having a molded resin (package) on the substrate is formed. The method generally employs transfer molding that cures resin within a mold.

The semiconductor device has to have a heatsink for dissipating, to the outside, heat generated from the semiconductor device. Therefore, it is necessary to expose a part of the semiconductor device. For a CCD (Charge Coupled Device) sensor for example, a resin encapsulation molding method for a semiconductor device is employed that partially exposes the semiconductor device for detection of light. Further, for a fingerprint detection device, a resin encapsulation molding method for a semiconductor device is employed that partially exposes the semiconductor device for finger touch.

A first example of the above-described conventional resin encapsulation molding method is disclosed in Japanese Patent Laying-Open No. 2004-119410 (see page 5 and FIGS. 1 and 2). According to the disclosed method, a press member is provided on a mold surface that contacts a part of the semiconductor device and, while the part of the semiconductor device is directly pressed by the press member, the device is encapsulated with resin. Over the press member, a coating film of an engineering plastic is formed.

A second example of the conventional resin encapsulation molding method is disclosed in Japanese Patent Laying-Open No. 2002-59453 (see page 9 and FIGS. 3 to 5). According to the disclosed method, a release film that partially covers a semiconductor device is used to resin-encapsulate the semiconductor device, not in the state where a part of the semiconductor device is in direct contact with a mold surface, but in the state where the part of the semiconductor device is covered with the release film.

The conventional resin encapsulation molding methods, however, encounter the following problems.

As for the aforementioned method of the first example, the coating film of the engineering plastic has its surface that may be uneven depending on the conditions of forming the coating film. Therefore, when the uneven surface of the coating film is brought into contact with the surface of the semiconductor device, gaps are formed between the semiconductor device and the coating film. From the gaps, resin leaks onto the surface of a part of the semiconductor device. In the end, resin flash is formed on the surface of the part of the semiconductor device. The aforementioned method of the second example improves adhesion between the release film and the semiconductor device to prevent resin flash from being formed. Thus, a considerably large clamping pressure of the mold is applied, resulting in damages to the semiconductor device such as crack and chipping.

SUMMARY OF THE INVENTION

The present invention has been made in consideration of the above-described problems and, an object of the invention is to provide a resin encapsulation molding method for a semiconductor device, preventing damages to the semiconductor device while preventing resin flash from being formed.

According to an aspect of the present invention, a resin encapsulation molding method for a semiconductor device is used to form a resin-encapsulated substrate having the semiconductor device that is mounted on the substrate and that has a portion which is exposed. According to the method, a device-mounted substrate on which the semiconductor device is mounted is prepared. Then, the device-mounted substrate is set in one mold part. A release film is thereafter provided between the device-mounted substrate and the other mold part opposite to the one mold part. Then, the one mold part and the other mold part are closed to press the release film against the portion. The device-mounted substrate has a projection enclosing the portion for preventing resin flash from being formed. In the step of closing, the release film is pressed against the projection to allow the projection to dig into the release film. With this method, it is prevented that melted resin flows onto the portion of the semiconductor device to accordingly form resin flash, while damages to the semiconductor device are prevented.

Preferably, the release film has a soft member layer and a hard member layer harder than the soft member layer. In the step of closing, preferably the soft member layer is pressed against the projection to allow the projection to dig into the soft member layer. With this method, it is further ensured that the soft member layer prevents resin flash from being formed.

Preferably, the other mold part has a press member that elastically deforms. In the step of closing, preferably the press member presses the release film against the portion. With this method, even if the device-mounted substrate varies to a great extent in dimension in the thickness direction, any negative effect due to the variation is alleviated by the press member. It is further ensured that the resin flash is prevented from being formed.

Preferably, the device-mounted substrate has an adhesive film that is placed between the substrate and the semiconductor device and that elastically deforms. With this method, even if the device-mounted substrate varies to a great extent in dimension in the thickness direction, any negative effect due to the variation is alleviated by the adhesive film.

According to another aspect of the present invention, a resin encapsulation molding method for a semiconductor device is used to form a resin-encapsulated substrate having the semiconductor device that is mounted on the substrate and that has a transparent member which is exposed. According to the method, a device-mounted substrate on which the semiconductor device having the transparent member is mounted is prepared. The device-mounted substrate is then set in one mold part. A release film is thereafter provided between the device-mounted substrate and the other mold part opposite to the one mold part. Then, the one mold part and the other mold part are closed to press the release film against a top surface of the transparent member. With this method, it is prevented that melted resin flows onto the top surface of the transparent member to accordingly form resin flash, while damages to the semiconductor device are prevented.

Preferably, the release film has a soft member layer and a hard member layer harder than the soft member layer. In the step of closing, preferably the soft member layer is pressed against the transparent member. With this method, it is further ensured that the soft member layer prevents resin flash from being formed.

Preferably, the other mold part has a press member that elastically deforms. In the step of closing, preferably the press member presses the release film against the transparent member. With this method, even if the device-mounted substrate varies to a great extent in dimension in the thickness direction, any negative effect due to the variation is alleviated by the press member. It is further ensured that the resin flash is prevented from being formed.

Preferably, the device-mounted substrate has an adhesive film that is placed between the substrate and the semiconductor device and that elastically deforms. With this method, even if the device-mounted substrate varies to a great extent in dimension in the thickness direction, any negative effect due to the variation is alleviated by the adhesive film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
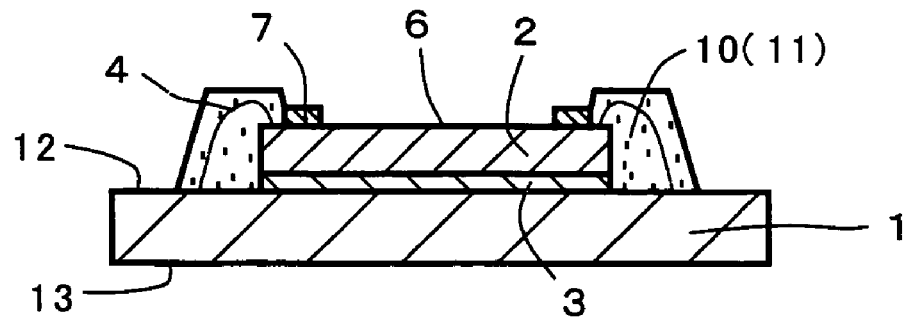
FIGS. 1 to 3 are each a cross-sectional view of a resin-encapsulated substrate (product) having an exposed portion of a semiconductor device or an exposed portion of a transparent member, according to an embodiment of the present invention.
Figure 2:
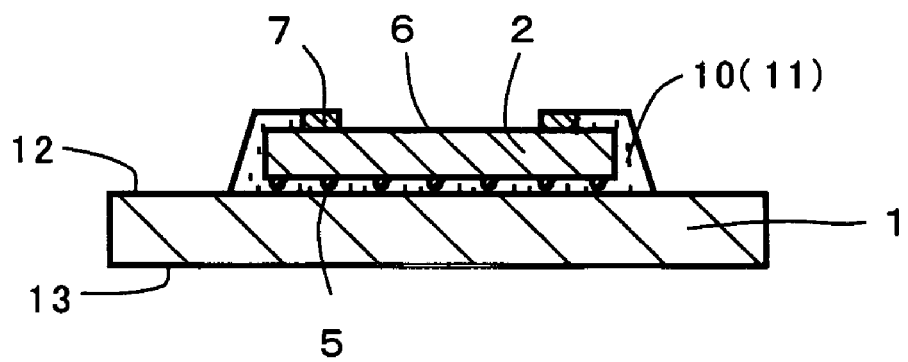
Figure 3:
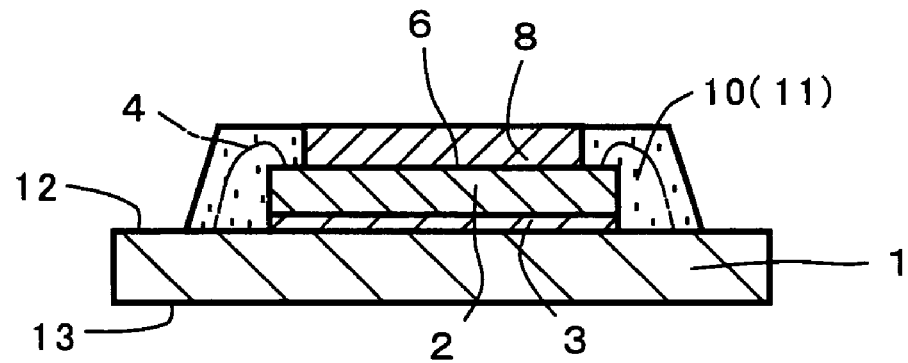

With reference to FIGS. 1 to 3, a resin encapsulation molding method for a semiconductor device is described according to an embodiment of the present invention. It is noted that, in the drawings, those parts denoted by like reference characters have like functions, and the description thereof will not be repeated.

A resin-encapsulated substrate (product) that is manufactured by the resin encapsulation molding method for a semiconductor device in the present embodiment refers to a substrate on which a semiconductor device is mounted, where a part of the semiconductor device or a part of a transparent member is exposed.

As shown in FIGS. 1 to 3, the resin-encapsulated substrate is a substrate in the shape of a circle or polygon for example and includes a lead frame. On substrate 1, semiconductor device 2 is mounted with an adhesive film 3 therebetween. Adhesive film 3 has both of the function of fixing semiconductor device 2 and substrate 1 and the function of elastically supporting semiconductor device 2 and substrate 1. While the resin-encapsulated substrates shown in FIGS. 1 and 3 have a wire 4 that electrically connects substrate 1 and semiconductor device 2, the resin-encapsulated substrate shown in FIG. 2 has bumps 5 for electrically connecting substrate 1 and semiconductor device 2 (flip chip).

Moreover, regarding the resin-encapsulated substrates shown in FIGS. 1 and 2, an annular projection 7 is provided on the top surface of semiconductor device 2 to enclose, as seen in plan view, a portion 6 of semiconductor device 2 (central portion of the top surface). Projection 7 is a metal pattern for preventing resin flash. Regarding the resin-encapsulated substrate shown in FIG. 3, the portion 6 of semiconductor device 2 is not exposed but covered with a transparent member 8 (for example glass material or plastic material).

The resin-encapsulated substrate has a molded resin 10 (cured resin 11) formed in an outer region of annular projection 7 to extend along the side and top surfaces of semiconductor device 2, an outer substrate periphery 12 that is a region on the outside of molded resin 10 and that is not resin-encapsulated, and a non-mounted surface 13 on the rear side of molded resin 10 with no component mounted thereon. Molded resin 10 is produced by curing melted resin 9.

For convenience of description, the embodiment is hereinafter described concerning a method using a set of mold halves to resin-encapsulate a single substrate 1 having a single semiconductor device 2 mounted thereon. The present invention, however, is applicable as well to a method using a set of mold halves to resin-encapsulate a single substrate having two or more semiconductor devices mounted thereon as well as a method using a set of mold halves to resin-encapsulate two or more substrates 1 each having a single semiconductor device mounted thereon. The present invention is also applicable to a method of resin-encapsulating a substrate having a plurality of stacked semiconductor devices that are stacked on the substrate in the direction of thickness.

Regarding the resin-encapsulated substrate shown in FIG. 1, since projection 7 is provided on the top surface of semiconductor device 2, it is prevented that melted resin flows onto the portion 6 of semiconductor device 2 to form resin flash on the top surface of semiconductor device 2. Moreover, substrate 1 and semiconductor device 2 are provided with adhesive film 3 therebetween. Therefore, even if semiconductor device 2 varies to a large extent in dimension in the thickness direction (height and gradient), adhesive film 3 serves as a cushion to prevent such damages as crack or chipping to semiconductor device 2.

If the surface of the portion 6 of transparent member 8 of the resin-encapsulated substrate shown in FIG. 3 has a projection, it is further ensured that resin flash is prevented from being formed on the portion 6 of transparent member 8. Although projection 7 is rectangular in shape in the cross section of FIGS. 1 to 3, the cross-sectional shape may be an arbitrary polygon or circle. Further, although projection 7 is a single annular metal pattern enclosing the portion 6 of semiconductor device 2 in FIGS. 1 to 3 each, two or more annular metal patterns enclosing the portion 6 of semiconductor device 2 as seen in plan view may be provided.

Figure 4:
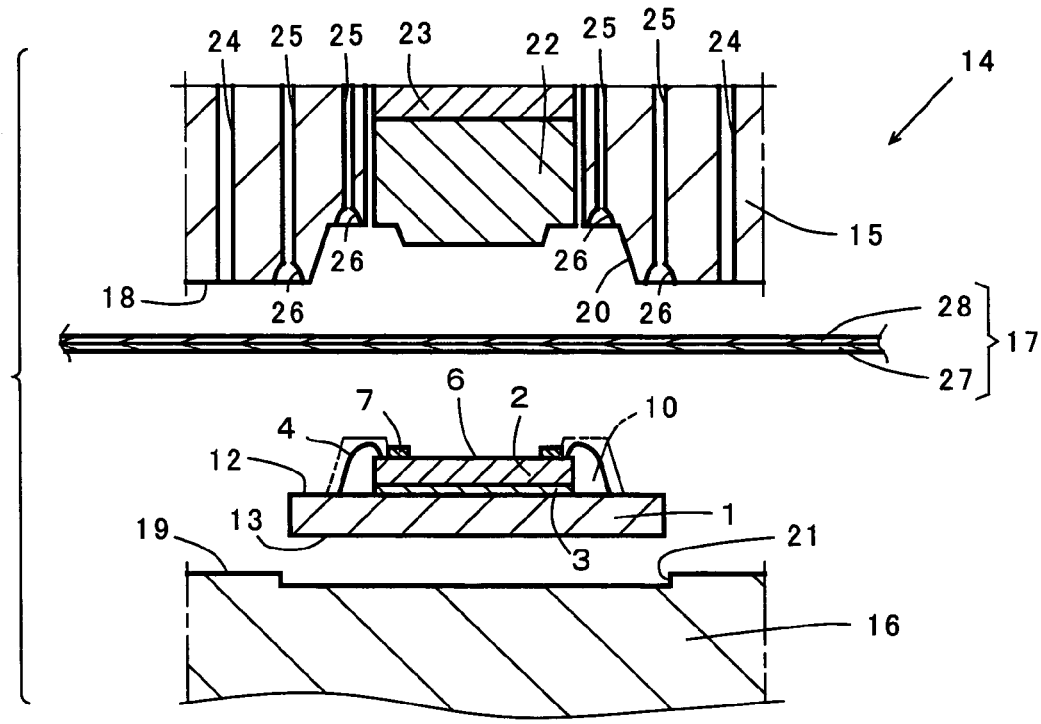
FIG. 4 is a cross-sectional view of a mold for resin encapsulation molding that is used for carrying out a resin encapsulation molding method according to the present embodiment.

With reference to FIG. 4, a resin encapsulation molding method for a semiconductor device of the present embodiment is described. According to the resin encapsulation molding method of the present embodiment, a mold 14 has a top mold half (hereinafter top mold) 15 and a bottom mold half (hereinafter bottom mold) 16 provided to be opposite to top mold 15 as shown in FIG. 4. Top mold 15 and bottom mold 16 are shown in FIG. 4 in an opened state. In the state shown in FIG. 4, substrate 1 is fed between top mold 15 and bottom mold 16 and semiconductor device 2 on which molded resin 10 (package) shown in FIG. 1 has not been formed is mounted on substrate 1. It is noted that a device-mounted substrate of the present invention refers to substrate 1 on which semiconductor device 2 where molded resin 10 has not been formed is mounted. In the present embodiment, a release film 17 is attached to a mold surface of top mold 15. Release film 17 serves to prevent resin from adhering to the mold surface of top mold 15.

Top mold 15 has a top mold surface 18 that is fixed in position while bottom mold 16 has a bottom mold surface 19 that is movable up and down. Top mold 18 has a cavity 20 communicating with a resin passage (not shown) extending in the direction perpendicular to the plane of FIG. 4, and semiconductor device 2 is inserted into cavity 20. Bottom mold surface 19 has a substrate set portion 21 in which substrate 1 before encapsulated with resin or resin-encapsulated substrate is fit.

Top mold 15 further has a press member 22 pressing the portion 6 of semiconductor device 2 together with projection 7 via release film 17. Press member 22 is a member that elastically deforms. Press member 22 is attached to top mold 15 via a spacer 23.

Top mold surface 18 has a suction hole 24 for sucking release film 17. On the inner side of suction hole 24, a suction/blowing hole 25 is provided. On an end of suction/blowing hole 25, a groove 26 is provided. Top mold 15 with the above-described structure can be used to suck the release film 17 and cover cavity 20 with release film 17 and to blow air on release film 17 to separate the release film 17 from cavity 20. In other words, release film 17 can be closely attached to cavity 20 with no wrinkle formed in the film.

Release film 17 is a film of a multi-layer structure (double-layer structure in FIG. 4) composed of a soft member layer 27 and a hard member layer 28 harder than soft member layer 27. Release film 17 is structured to allow projection 7 to dig into soft member layer 27 when release film 17 covers the portion 6 of semiconductor device 2 (see FIG. 8).

Figure 8:
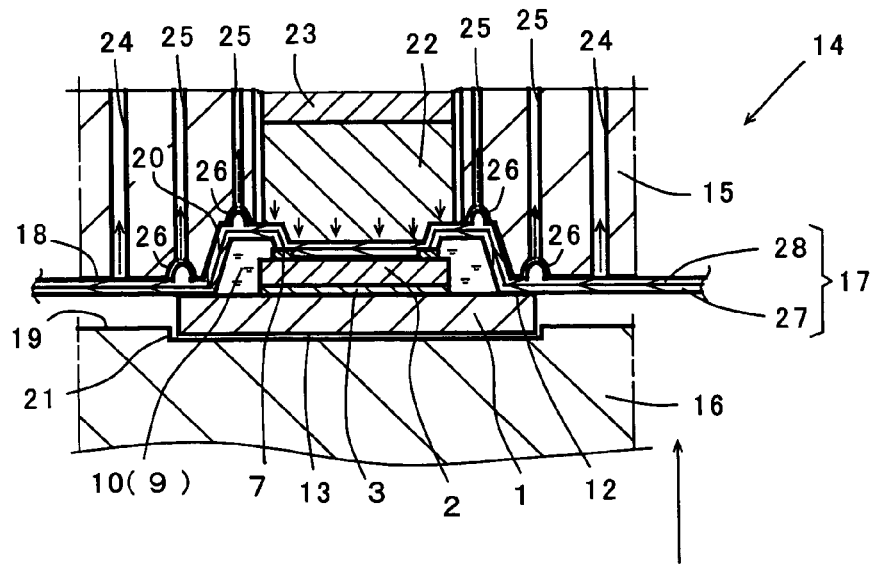
FIG. 8 is a cross-sectional view of the mold shown in FIG. 4, showing a state in which the mold is closed and, in an outer region of a projection, side and top surfaces of a semiconductor device are covered with melted resin.

Press member 22 has heat resistance resisting a high temperature state of mold 14. As mentioned above, press member 22 has required elasticity to press the portion 6 of semiconductor device 2 when mold 14 shown in FIG. 8 is in closed state. At this time, press member 22 slightly shrinks in the up-and-down direction. Press member 22 is returned to an initial state when mold 14 shown in FIG. 4 is opened. In other words, press member 22 has cushion property.

In other words, regarding the mold of the present embodiment, press member 22 itself is elastic as compared with the conventional mold having a coating film that is formed on the press member and that is the only elastic component.

Press member 22 is preferably made of resin-based material (for example engineering plastic, silicon rubber or the like) or rubber-based material.

As for the resin encapsulation molding method for the resin-encapsulated substrate having transparent member 8 provided on the portion 6 of semiconductor device 2, transparent member 8 is lower in mechanical strength than semiconductor device 2. Further, transparent member 8 varies to a large extent in dimension in the thickness direction. Furthermore, when many transparent members 8 are provided on a single substrate 1, the substrate that has not been resin-encapsulated varies to a greater extent in dimension in the thickness direction. Thus, there is a problem that the transparent member for example is susceptible to damages. Regarding the resin-encapsulated substrate of the present embodiment, however, adhesive film 3 and press member 22 are provided to prevent occurrences of crack or chipping for example in semiconductor device 2 or transparent member 8 even if semiconductor device 2 and transparent member 8 vary to a great extent in dimension in the thickness direction.

Since the resin molding is carried out in the state in which top mold surface 18 is covered with release film 17, no problem arises that is due to poor mold releasability between the mold surface of mold 14 and molded resin 10 (package).

Although the resin encapsulation molding method for a semiconductor device in this embodiment uses the mold comprised of two mold parts, a mold comprised of a plurality of, namely three or more mold parts may be used for the present invention.

Further, although the resin encapsulation molding method for a semiconductor device in the present embodiment uses only release film 17 for covering top mold surface 18, a release film 17 for covering bottom mold surface 19 may be used. In this case, an adhesive layer may be provided on the surface, which faces non-mounted surface 13, of release film 17 covering bottom mold surface 19.

The resin encapsulation molding method of the present embodiment uses transfer molding. However, the resin encapsulation molding method of the present invention may use any molding method except for the transfer molding, namely substrate dip molding or substrate compression molding.

The present invention is also applicable to a resin encapsulation molding method for a semiconductor device that uses a resin-encapsulated substrate, a release film and a mold that are in the reverse state in the up-and-down direction with respect to the state of the resin-encapsulated substrate, release film 17 and mold 14 shown in FIG. 4.

Figure 5:
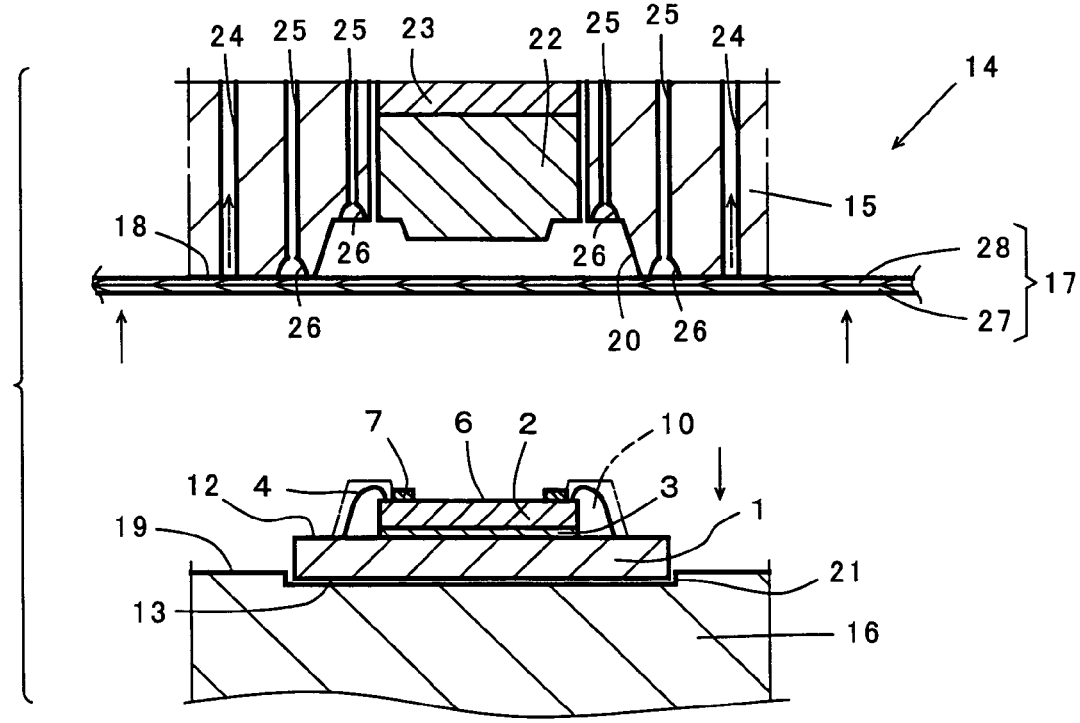
FIGS. 5 to 7 are each a cross-sectional view of the mold shown in FIG. 4 before the resin encapsulation, showing step-by-step the process of allowing a release film to be closely attached to a mold surface of a top mold while the substrate is set in a bottom mold.
Figure 6:
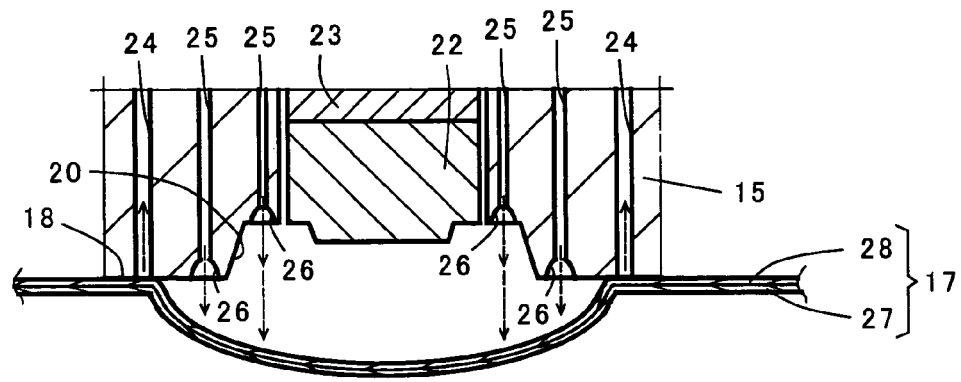
Figure 7:
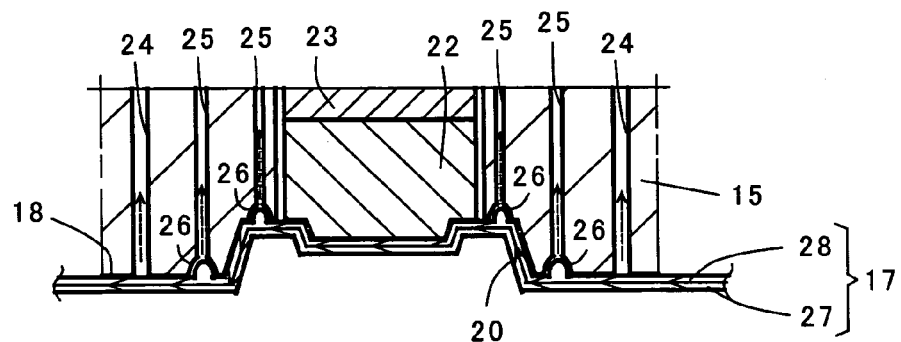

With reference to FIGS. 4 to 7, the resin encapsulation molding method for semiconductor device 2 of the present embodiment is now specifically described. In FIGS. 6 and 7, bottom mold 16 is not shown.

First, as shown in FIG. 4, while mold 14 (top mold 15 and bottom mold 16) is opened, release film 17 in a tensioned state is inserted between top mold surface 18 and semiconductor device 2. In other words, substrate 1 that has not been encapsulated is provided between release film 17 located above substrate set portion 21 and bottom mold surface 19.

Then, as shown in FIG. 5, substrate 1 before resin-encapsulated is fit in substrate set portion 21. The state where substrate 1 before resin-encapsulated is set in substrate set portion 21 is maintained as well in the stages shown in FIGS. 6 and 7.

Release film 17 in the tensioned state is moved upward so that hard member layer 28 is brought into contact with top mold surface 18. At substantially the same time, suction hole 24 sucks release film 17. Accordingly, release film 17 is closely attached to top mold surface 18. Before this state is attained, the whole mold 14 is preferably heated to a temperature necessary for melting resin.

Subsequently, as shown in FIG. 6, while suction hole 24 is sucking release film 17, air is blown onto release film 17 from suction/blowing hole 25 with groove 26 that is provided on the inner side of suction hole 24. Accordingly, release film 17 located directly below cavity 20 is roundly expanded in the downward direction. At this time, if mold 14 is heated, release film 17 easily attains the roundly and downwardly expanded state.

Then, the air blow from suction/blowing hole 25 to release film 17 is stopped. After this, as shown in FIG. 7, while suction hole 24 is sucking release film 17, suction/blowing hole 25 located on the inner side of suction hole 24 sucks, step by step, release film 17 that roundly expands in the downward direction. Accordingly, release film 17 is extended without wrinkle and closely attached to cavity 20. In the present embodiment, since release film 17 extends into groove 26, release film 17 is easily attached closely to cavity 20. Thus, it is efficiently prevented that wrinkles are formed in release film 17.

Then, as shown in FIG. 8, while release film 17 shown in FIG. 7 is closely attached to the whole top mold surface 18, bottom mold 16 is moved upward. Accordingly, outer substrate periphery 12 is brought into contact with soft member layer 27 of release film 17 and then mold 14 is closed. Before the mold is closed, the whole mold 14 is heated to a temperature necessary for melting resin and melted resin 9 is injected through the resin passage to cavity 20. Transfer molding is thus carried out.

At this time, projection 7 enclosing the portion 6 of semiconductor device 2 digs into soft member layer 27 of release film 17. While press member 22 elastically deforms, press member 22 presses the portion 6 of semiconductor device 2 and projection 7 via release film 17. Adhesion film 3 also elastically deforms between semiconductor device 2 and substrate 1.

In the present embodiment, while mold 14 is closed as shown in FIG. 8, bottom mold 16 cannot move upward to the position of pressing top mold 15 via release film 17. However, if the depth of substrate set portion 21 and the thickness of substrate 1 are substantially equal to each other or the depth of substrate set portion 21 is larger than the thickness of substrate 1, the mold can be closed in such a manner that allows bottom mold 16 to press top mold 15 via release film 17.

After this, when a predetermined time period has passed, melted resin 9 is cured while the side and top surfaces of semiconductor device 2 in the outer region of projection 7 are covered with melted resin 9. Accordingly, molded resin 10 (cured resin 11) is formed on substrate 1 and the resin-encapsulated substrate as shown in FIG. 1 is completed.

Figure 9:
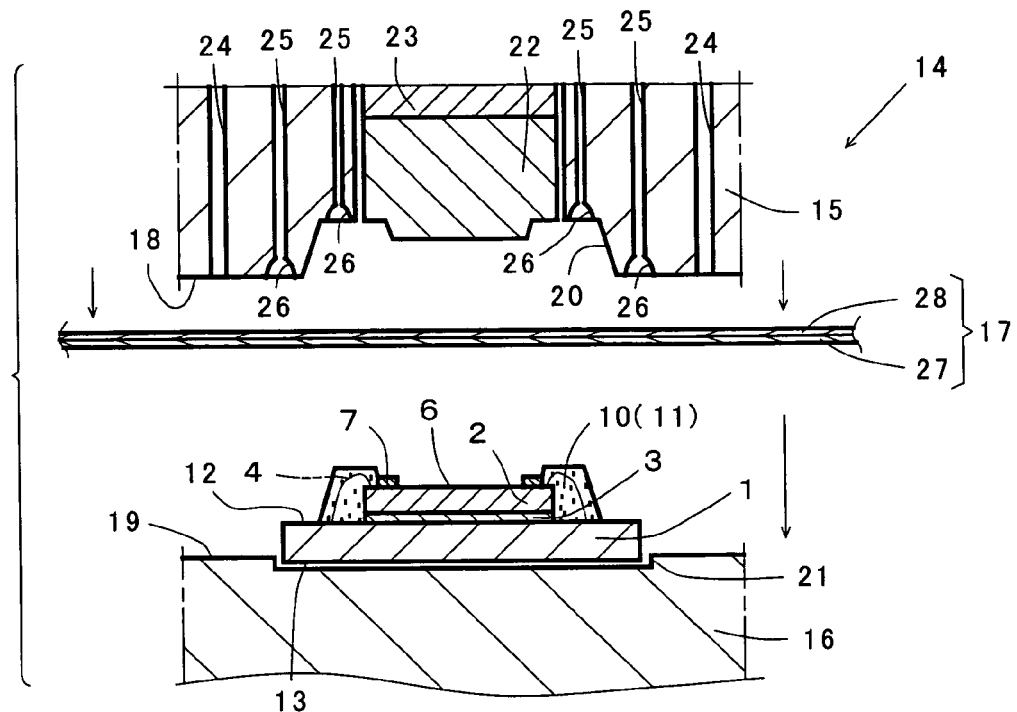
FIG. 9 is a cross-sectional view of the mold shown in FIG. 4, showing a state in which the mold is opened and the resin-encapsulated substrate with an exposed portion of the semiconductor device is formed.
Figure 10:
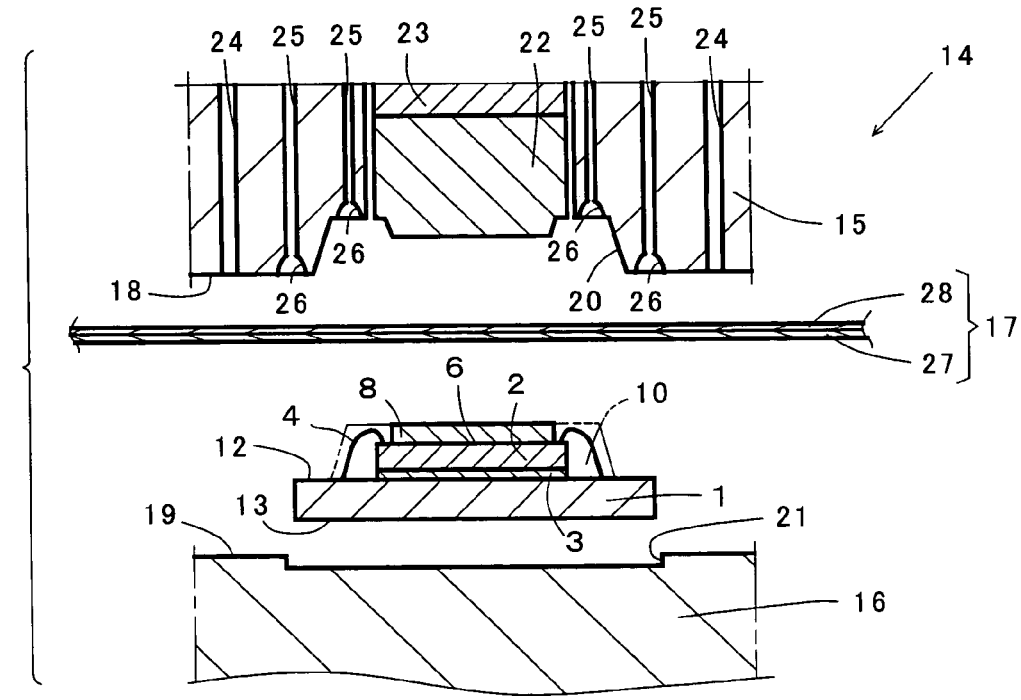
FIGS. 10 to 13 illustrate a method of manufacturing a resin-encapsulated substrate having the transparent member shown in FIG. 3 that is exposed, showing respective steps of a process corresponding to the steps of the process of manufacturing the resin-encapsulated substrate having the semiconductor device with an exposed portion as shown in FIGS. 4, 5, 8 and 9.
Figure 11:
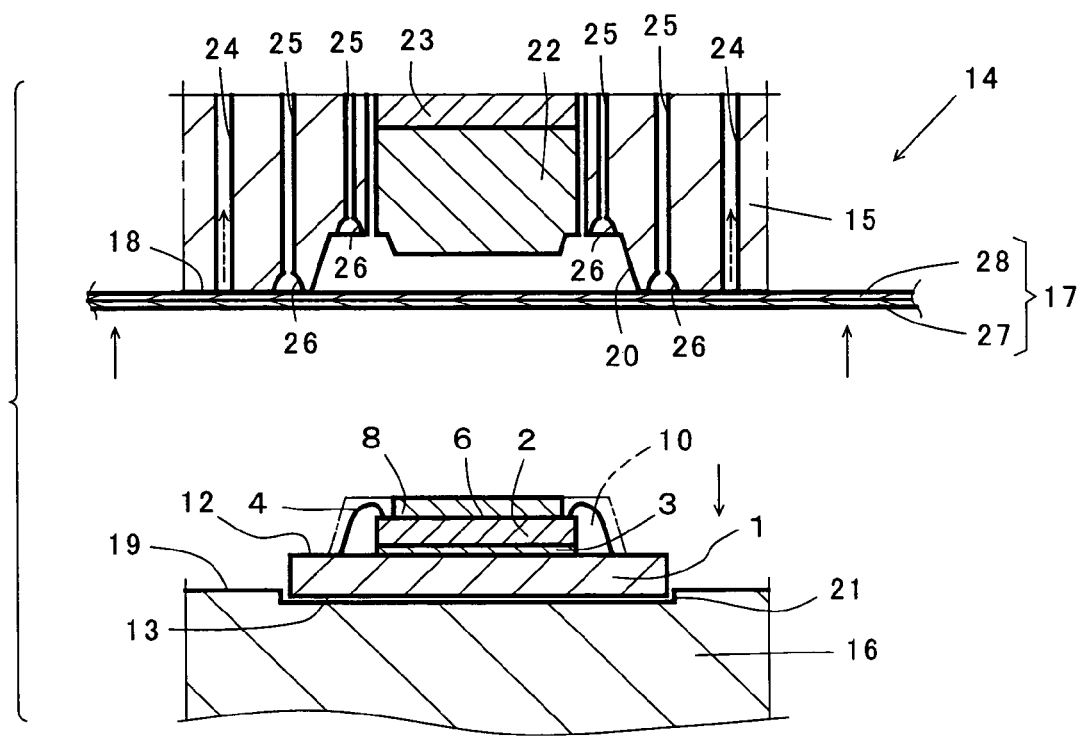
Figure 12:
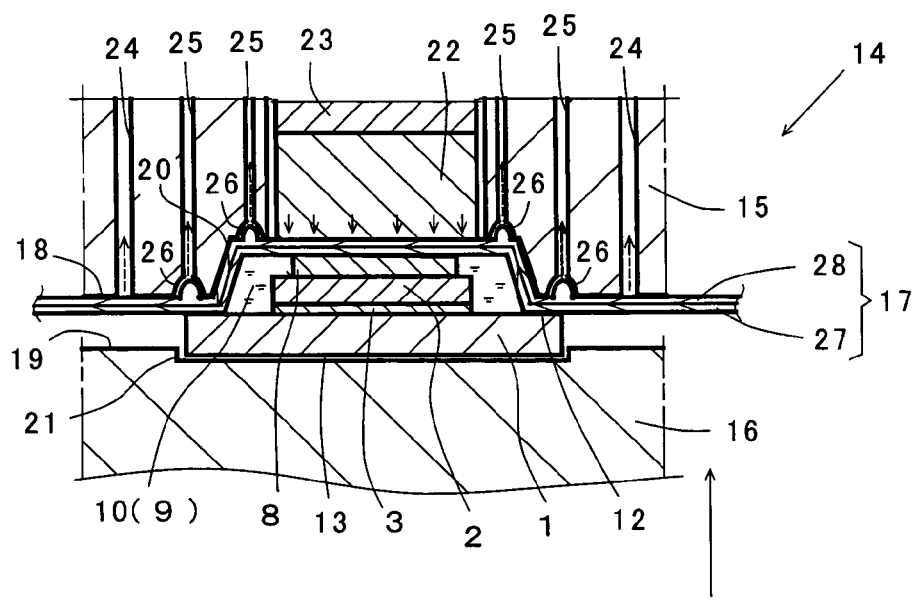
Figure 13:
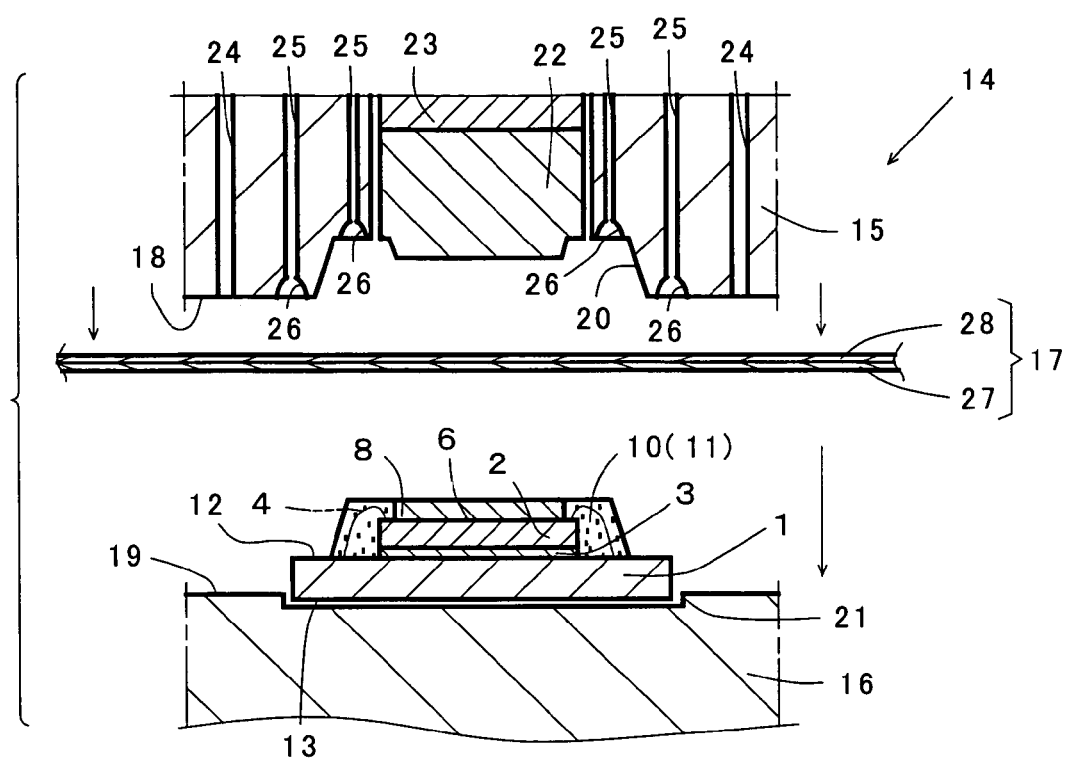

Then, as shown in FIG. 9, while the resin-encapsulated substrate is set in bottom mold 16, bottom mold 16 is moved downward so that mold 14 is opened as shown in FIG. 4. At this time, since release film 17 is present between molded resin 10 and cavity 20, any problem due to poor mold releasability between molded resin 10 and cavity 20 does not occur. Further, substantially simultaneously with the stop of the suction of release film 17 by suction hole 24 and suction/blowing hole 25, release film 17 is moved downward to be separated from top mold surface 18 and cavity 20. Thus, since release film 17 is tensioned, release film 17 extends substantially along the lateral plane.

Through the above-described series of steps in the resin encapsulation molding process, the resin encapsulation can be performed on substrate 1 that has not been encapsulated.

Although only the process of forming the resin-encapsulated substrate shown in FIG. 1 has been described in connection with the present embodiment, the process of forming the resin-encapsulated substrate produced by the flip-chip as shown in FIG. 2 is identical to the above-described process.

The resin-encapsulated substrate shown in FIG. 3 differs from the resin-encapsulated substrate shown in FIG. 1 in that transparent member 8 is provided on the top surface of semiconductor device 2 instead of projection 7. Since the process of manufacturing the resin-encapsulated substrate shown in FIG. 3 is, as shown in FIGS. 10-13, substantially identical to the process shown in FIGS. 4, 5, 8 and 9, the description thereof is not repeated. With the resin encapsulation molding method shown in FIGS. 10-13, resin flash is prevented from being formed on the top surface of transparent member 8.

Further, even if respective transparent members 8 of a plurality of products are different to a large extent in dimension in the thickness direction, press member 22 and adhesive film 3 are respectively members that elastically deform so that the difference is absorbed by the elastic deformation of press member 22 and adhesive film 3.

In FIG. 8, press member 22 presses release film 17 against the portion 6 of semiconductor device 2 and projection 7 digs into soft member layer 27 of release film 17. In contrast, in FIG. 12, press member 22 presses release film 17 against the entire top surface of transparent member 8 while the press member is compression-deformed at this time, and thus the presence of transparent member 8 on the top surface of semiconductor device 2 can appropriately be addressed, which is illustrated with some exaggeration. In this respect only, those processes differ from each other.

In the case where an annular projection is provided on the transparent member and a relevant resin encapsulation molding method prevents, with the annular projection, resin flash from being formed on the transparent substrate, it is supposed that semiconductor device 2 shown in FIGS. 4-9 includes both of the semiconductor device and the transparent member.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resin encapsulation molding method for a semiconductor device to form a resin-encapsulated substrate having the semiconductor device that is mounted on the substrate and that has a portion exposed, comprising the steps of:
    preparing a device-mounted substrate on which said semiconductor device is mounted;
    setting said device-mounted substrate in one mold part;
    providing a release film between said device-mounted substrate and the other mold part opposite to said one mold part; and
    closing said one mold part and said other mold part to press said release film against said portion, wherein
    said device-mounted substrate has a projection enclosing said portion for preventing resin flash from being formed and,
    in said step of closing, said release film is pressed against said projection to allow said projection to dig into said release film.

2. The resin encapsulation molding method for a semiconductor device according to claim 1, wherein
    said release film has a soft member layer and a hard member layer harder than said soft member layer and,
    in said step of closing, said soft member layer is pressed against said projection to allow said projection to dig into said soft member layer.

3. The resin encapsulation molding method for a semiconductor device according to claim 1, wherein
    said other mold part has a press member that elastically deforms and,
    in said step of closing, said press member presses said release film against said portion.

4. The resin encapsulation molding method for a semiconductor device according to claim 1, wherein
    said device-mounted substrate has an adhesive film that is placed between said substrate and said semiconductor device and that elastically deforms.

* * * * *